(12) United States Patent
Dickow

(10) Patent No.: US 10,800,603 B2
(45) Date of Patent: Oct. 13, 2020

(54) SWITCHGEAR CABINET FOR EXHAUST GAS MEASURING FACILITIES

(71) Applicant: AVL EMISSION TEST SYSTEMS GMBH, Neuss (DE)

(72) Inventor: Achim Dickow, Velbert (DE)

(73) Assignee: AVL EMISSION TEST SYSTEMS GMBH, Neuss (DE)

(*) Notice: Subject to any disclaimer, the term of this patent is extended or adjusted under 35 U.S.C. 154(b) by 105 days.

(21) Appl. No.: 16/069,521

(22) PCT Filed: Dec. 9, 2016

(86) PCT No.: PCT/EP2016/080414
§ 371 (c)(1),
(2) Date: Jul. 12, 2018

(87) PCT Pub. No.: WO2017/121552
PCT Pub. Date: Jul. 20, 2017

(65) Prior Publication Data
US 2019/0031432 A1  Jan. 31, 2019

(30) Foreign Application Priority Data
Jan. 15, 2016 (DE) .......................... 10 2016 100 640

(51) Int. Cl.
*B65D 88/74* (2006.01)
*H05K 7/20* (2006.01)
*G01M 15/10* (2006.01)
*A47B 81/00* (2006.01)

(52) U.S. Cl.
CPC ............ *B65D 88/744* (2013.01); *A47B 81/00* (2013.01); *G01M 15/102* (2013.01); *H05K 7/20145* (2013.01)

(58) Field of Classification Search
CPC ............... B65D 88/744; G01M 15/102; H05K 7/20145; A47B 81/00
USPC ......................................................... 62/259.1
See application file for complete search history.

(56) References Cited

U.S. PATENT DOCUMENTS

| 6,375,561 B1 | 4/2002 | Nicolai et al. |
| 2004/0182799 A1 | 9/2004 | Tachibana |
| 2005/0168945 A1 | 8/2005 | Coglitore |

(Continued)

FOREIGN PATENT DOCUMENTS

| CN | 1263693 A | 8/2000 |
| CN | 2747566 Y | 12/2005 |

(Continued)

OTHER PUBLICATIONS

Wohlfarth Joerg, Apparatus for Actively Ventilating Built-In Components of a Withdrawable Part of a Switchgear Cabinet, Sep. 2012, European Patent Office, English Translation (Year: 2012).*

*Primary Examiner* — Steve S Tanenbaum
(74) *Attorney, Agent, or Firm* — Norman B. Thot

(57) ABSTRACT

A control cabinet for an exhaust gas measuring facility. The control cabinet includes a cabinet body with measuring appliances for analyzing at least one sample gas. The cabinet body includes two side walls, a bottom, a cover, a first rear wall, a second rear wall, a front side, and a channel which is arranged between the first rear wall and the second rear wall. The channel is dissipates heat. A door opens and closes the front side of the cabinet body.

14 Claims, 3 Drawing Sheets

(56) References Cited

U.S. PATENT DOCUMENTS

Figure 1:
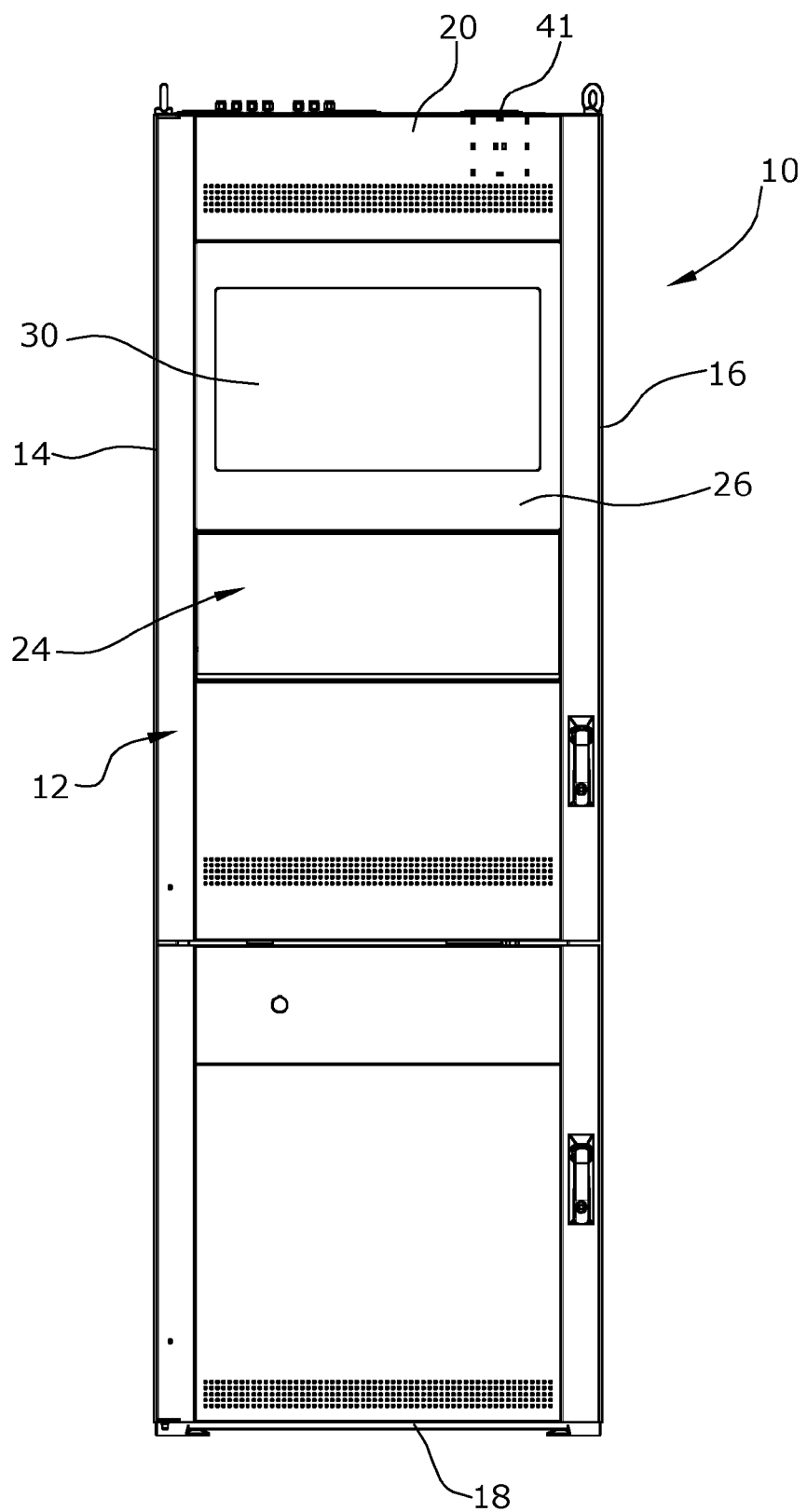
Figure 2:
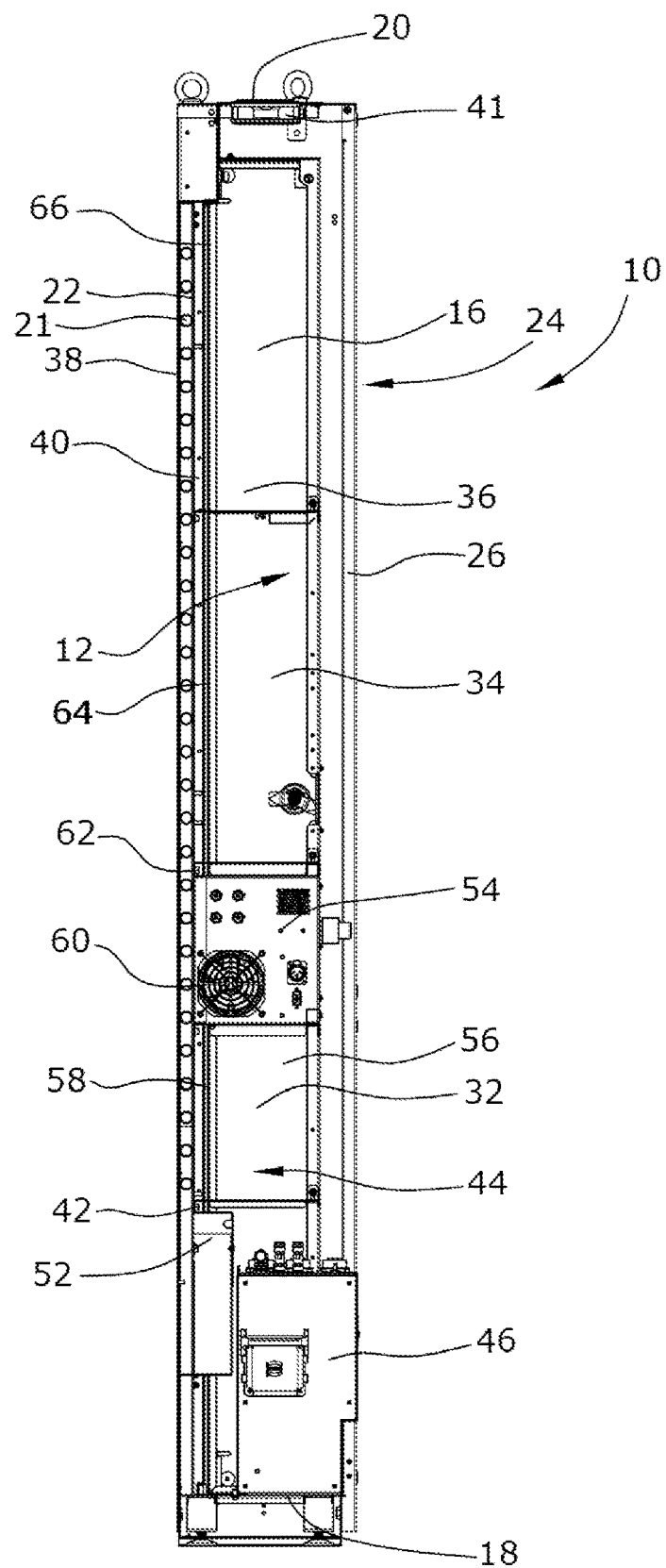
Figure 3:
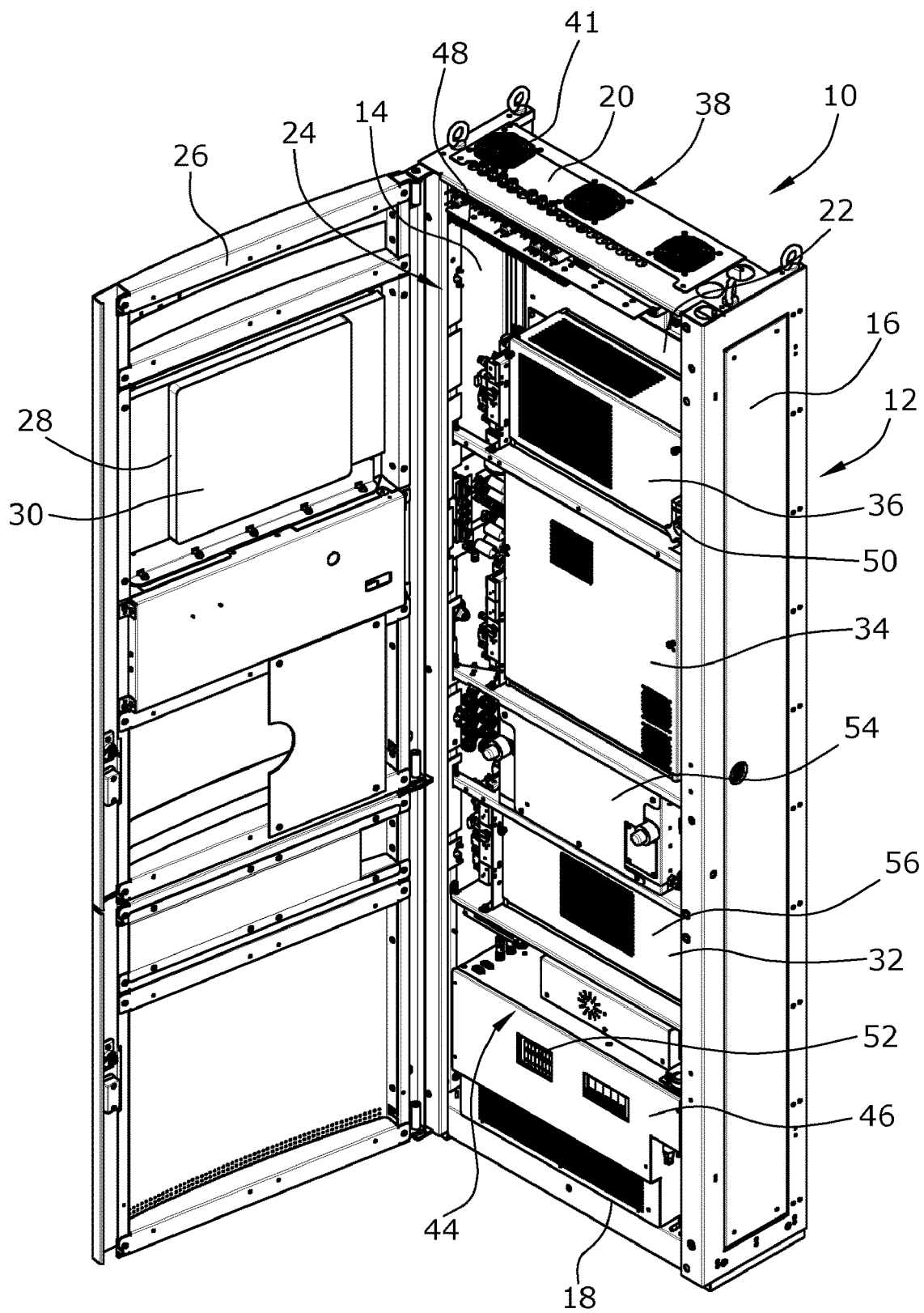

| | | | |
|---|---|---|---|
| 2009/0188682 A1* | 7/2009 | Gensel | A62C 37/40 169/46 |
| 2012/0287418 A1 | 11/2012 | Scherer et al. | |
| 2013/0037253 A1 | 2/2013 | Schneider et al. | |
| 2014/0260397 A1 | 9/2014 | Agnaou et al. | |
| 2015/0125345 A1 | 5/2015 | Kreft | |

FOREIGN PATENT DOCUMENTS

| | | | |
|---|---|---|---|
| CN | 103430646 A | 12/2013 | |
| CN | 103872603 A | 6/2014 | |
| CN | 104335028 A | 2/2015 | |
| DE | 20 2009 014 666 U1 | 4/2010 | |
| DE | 10 2014 102 050 A1 | 8/2015 | |
| EP | 2 317 833 A1 | 5/2011 | |
| JP | 53-60846 U | 5/1978 | |
| JP | 5-15423 A | 1/1993 | |
| JP | 8-233738 A | 9/1996 | |
| JP | 9-232780 A | 9/1997 | |
| JP | 2007-140096 A | 6/2007 | |
| JP | 2008-309581 A | 12/2008 | |
| JP | 2013-65913 A | 4/2013 | |
| KR | 10-2013-0044221 A | 5/2013 | |
| WO | WO-2012126821 A1 * | 9/2012 | H05K 7/1432 |

\* cited by examiner

SWITCHGEAR CABINET FOR EXHAUST GAS MEASURING FACILITIES

CROSS REFERENCE TO PRIOR APPLICATIONS

This application is a U.S. National Phase application under 35 U.S.C. § 371 of International Application No. PCT/EP2016/080414, filed on Dec. 9, 2016 and which claims benefit to German Patent Application No. 10 2016 100 640.8, filed on Jan. 15, 2016. The International Application was published in German on Jul. 20, 2017 as WO 2017/121552 A1 under PCT Article 21(2).

FIELD

The present invention relates to a control cabinet for exhaust gas measuring facilities comprising a cabinet body in which measuring appliances for the analysis of sample gases are arranged and which includes two side walls, a bottom, a cover and a rear wall, and comprising a door for opening and closing an open front side of the cabinet body.

BACKGROUND

Such control cabinets are used at roller test benches of motor vehicles, for example, which include a CVS facility. These control cabinets comprise the power supply unit, driving system, electronic system and cooling units as well as the regulating members in the exhaust gas measuring facility and the measuring appliances required for the analysis of the exhaust gas for determining the pollutant quantities in the exhaust gas, such as flame ionization detector analysis appliances for determining hydrocarbons, or via a gas chromatograph for determining methane quantities, chemiluminescence detector analysis appliances for determining nitrogen oxide quantities in the exhaust gas as well as infrared detector analysis appliances for determining various active components, such as carbon monoxide, carbon dioxide or hydrocarbon compounds in the exhaust gas. The control cabinet is accordingly connected to the sampling probes of the exhaust gas measuring facility via leads which are connected to the control cabinet via corresponding couplings. A calibration gas unit suitable for all measuring appliances is also usually arranged in the control cabinet.

These cabinets in most cases comprise an operating unit at the door closing the front side via which the overall facility as well as the measuring appliances inside the cabinet are controlled by the operating personnel and via which the analysis data can directly be queried.

A control cabinet for an exhaust gas measuring facility is, for example, described in EP 2 317 833 A1. This control cabinet is composed of two cabinet portions which can be arranged one in front of the other and which are connected with each other via flexible leads. The rear cabinet portion serves for connection to the CVS facility, while the movable front cabinet portion comprises the measuring appliances of the facility, which are connected to the rear cabinet portion via the leads.

Such control cabinets are problematic in that heat must, for example, be generated to heat the gas to be measured to a predefined temperature and heat is generated in the measuring appliances which must be reliably dissipated in order to avoid damage to the measuring appliances and to the electronic system in the control cabinet by thermal overload.

SUMMARY

An object of the present invention is to provide a control cabinet for exhaust gas measuring facilities where damage to the measuring appliances and the existing electronic system by thermal overload can be reliably avoided and a largely constant temperature in the control cabinet can be attained. Another aspect of the present invention is to thereby largely maintain the dimensions of the control cabinet while avoiding any additional cost-intensive appliances.

In an embodiment, the present invention provides a control cabinet for an exhaust gas measuring facility. The control cabinet includes a cabinet body configured to have measuring appliances arranged therein for analyzing at least one sample gas. The cabinet body includes two side walls, a bottom, a cover, a first rear wall, a second rear wall, a front side, and a channel which is arranged between the first rear wall and the second rear wall. The channel is configured to dissipate heat. A door opens and closes the front side of the cabinet body.

BRIEF DESCRIPTION OF THE DRAWINGS

The present invention is described in greater detail below on the basis of embodiments and of the drawings in which:

FIG. 1 shows a front view of an empty switchgear for an exhaust gas measuring facility according to the present invention;

FIG. 2 shows a cross-sectional side view of the control cabinet according to the present invention shown in FIG. 1; and FIG. 3 shows a perspective view of the fully equipped open control cabinet according to the present invention.

DETAILED DESCRIPTION

Due to the fact that the cabinet body comprises a second rear wall, wherein a channel for heat dissipation is formed between the first rear wall and the second rear wall, the heat produced in the control cabinet can be dissipated since it unimpededly rises due to the lower density in the channel. The thermal load of the components arranged in the control cabinet is accordingly reduced.

In an embodiment of the present invention, at least one fan can, for example, be arranged in the control cabinet via which an air flow is adapted to be generated in the channel. This fan provides a constant air movement in the channel, via which a cooling effect on the rear walls is attained and heat can be actively dissipated upwards.

In an embodiment of the present invention, the first rear wall facing an interior of the control cabinet can, for example, be shorter than the second rear wall so that the first rear wall is arranged in a spaced relationship to the bottom of the cabinet body. Air can enter from inside the control cabinet into the channel via this opening and, accordingly, be dissipated from the control cabinet.

It is particularly advantageous when a power supply unit is arranged between the bottom of the cabinet body and a lower end of the first rear wall, as seen in the vertical direction, so that the heat produced at the power supply unit can directly be dissipated into the channel without first flowing into the inside of the cabinet.

In an embodiment of the present invention, the at least one fan can, for example, be arranged between the bottom of the cabinet body and the lower end of the first rear wall, as seen in the vertical direction, whereby the heat produced in this area can directly be dissipated into the channel.

In an embodiment of the present invention, air is adapted to be delivered by the fan from the interior of the control cabinet towards the channel between the first rear wall and the second rear wall. The fan takes in the hot air from inside the cabinet body and delivers it into the channel between the rear walls where the hot air flow is automatically dissipated due to the density difference to the cooler air present there or again via a fan.

In an embodiment of the present invention, an opening can, for example, be formed in the first rear wall where the at least one fan is arranged via which air from the interior of the cabinet body is adapted to be delivered into the channel between the first rear wall and the second rear wall. This fan accordingly sucks the hot air from the interior of the cabinet body into the channel from which the hot air is dissipated upwards.

In an embodiment of the present invention, a cooler can, for example, be arranged at the first rear wall via which the rear wall of the control cabinet or one of the measuring appliances is cooled. The overall surface of the rear wall can be used as a cooling surface in this configuration since the latter is cooled down by the cooler or the hotter exhaust air of the cooler is directly dissipated via the channel in the case of direct cooling of a measuring appliance.

In an embodiment of the present invention, the cooler and the fan can, for example, be arranged at the opening in the first rear wall so that the hot exhaust air of the cooler is delivered along the channel and does not heat the interior. The thermal load of the entire interior of the control cabinet thereby decreases.

In an embodiment of the present invention, the measuring appliances for the exhaust gas analysis can, for example, rest against the first rear wall. The thermal load produced at the appliances can thus be directly dissipated by convection via the rear wall and the channel.

In an embodiment of the present invention, side walls of the measuring appliances can, for example, include different side surfaces, wherein the largest side surface of the measuring appliances rests against the first rear wall. A particularly large heat transfer to the rear wall takes place thereby due to the large contact surface and thus a maximum heat quantity can be dissipated via the channel, whereby a thermal overload of the measuring appliances in the control cabinet is reliably avoided.

It is further advantageous when the first rear wall is adapted to be actively cooled, whereby defined heat quantities of any magnitude can be reliably dissipated. Cooling coils can, for example, be arranged at the first rear wall for this purpose via which a coolant is adapted to be delivered.

A particularly advantageous embodiment is provided when the measuring appliances generate different heat quantities, wherein, with increasing heat quantity generation, the measuring appliances are arranged further upwards in the control cabinet. The cooling effect via the rear wall and the channel is thus increased since too large a heat quantity from the lower area is prevented from flowing along the other appliances. A temperature difference relative to the temperature of the measuring appliance arranged further above instead always exists so that a cooling effect on the measuring appliance arranged further above towards which the air flows is always realized.

It is also advantageous when the first rear wall ends beneath the cover and in the cover at least one fan is arranged via which air from the channel and the interior of the control cabinet is adapted to be delivered. The air from the channel is accordingly actively dissipated into the environment.

A control cabinet for exhaust gas measuring facilities is thus provided where the heat produced in the control cabinet can be reliably dissipated without the need to install additional exhaust air pipes. The thermal load of the measuring appliances as well as the electronic system installed in the control cabinet accordingly decreases. The size of the control cabinet is also reduced. The temperature in the control cabinet can be kept at a largely constant level depending on the configuration.

An exemplary embodiment of a control cabinet for an exhaust gas measuring facility according to the present invention is illustrated in the drawings and is described below.

The control cabinet 10 for an exhaust gas measuring facility according to the present invention is composed of a first cabinet body 12 comprising a first side wall 14, an opposite side wall 16, a bottom 18, a cover 20 as well as a first rear wall 22. Cooling coils 21 are arranged at the first real wall to actively cool the first rear wall 22. The cooling coils 21 are configured to have a coolant be delivered therethrough. A front side 24 of the control cabinet 10 is adapted to be closed by a door 26 which is pivotably attached to the first side wall 14. A recess 28 is provided at the door 26 in which an operating unit 30 in the form of a touchscreen is attached via which a connected exhaust gas measuring facility is adapted to be controlled and via which the measuring appliances 32, 34, 36 for the analysis of sampling gases arranged in the control cabinet 10 are adapted to be driven and whose measured results are adapted to be retrieved.

According to the present invention, the control cabinet 10 includes a second rear wall 38 which is arranged in spaced relationship to the first rear wall 22 behind the first rear wall 22 and in parallel thereto. This second rear wall 38 is attached to the rear ends of the two side walls 14, 16 which project rearwards beyond the first rear wall 22 so that between the two rear walls 22, 38 and the rear ends of the side walls 14, 16 a narrow channel 40 for heat dissipation is formed which is open in the upward direction. The first rear wall 22 also ends short of the cover 20 so that via a fan 41 at the cover 20 exhaust air is extracted both from the interior and actively from the channel 40.

A lower end 42 of the first rear wall 22 is also arranged in a spaced relationship to the bottom 18. In this lower area of the control cabinet 10 in which the first rear wall 22 is omitted, a power supply unit 46 of the control cabinet 10 is arranged in the interior 44 of the control cabinet 10. A calibration gas unit 48 as well as a measuring gas distributor 50, via which the measuring appliances 32, 34, 36 are supplied with the measuring gas or the calibration gas and which, accordingly, include a connection to the exhaust gas measuring facility through a coupling or an opening at the control cabinet 10 via a connecting pipe (not shown in the drawings), are also arranged in the control cabinet 10.

In this lower area of the control cabinet 10 directly beneath the lower end of the first rear wall 22, a first fan 52 is arranged which delivers air from the interior 44 of the control cabinet 10 between the door 26 and the first rear wall 22 into the channel 40 between the two rear walls 22, 38.

In the interior 44 above the power supply unit 46, an infrared detector analysis appliance for determining various active components, such as carbon monoxide, carbon dioxide or hydrocarbon compounds, is arranged as a first measuring appliance 32. It is coupled to an additional cooler 54 located above it which cools the measuring gas of the infrared detector analysis appliance 32 and whose hot exhaust air is directly dissipated via the channel 40. For this purpose, the first measuring appliance 32 and the cooler 54 are directly attached to the rear wall 22. The infrared detector analysis appliance 32 includes various side walls 56 of which the side wall with the largest side surface 58 rests against the rear wall 22. The cooler 54 as well as another fan 60 are attached in an opening 62 in the first rear wall 22 so that the air from the interior 44 is delivered into the channel 40 between the rear walls 22, 38.

Above the infrared detector analysis appliance 32, a chemiluminescence detector analysis appliance for determining nitrogen oxide quantities in the exhaust gas is attached, again via its largest side surface 64, as a second measuring appliance 34 to the rear wall 22.

Above the chemiluminescence detector analysis appliance 34, a flame ionization detector analysis appliance for determining hydrocarbons is arranged as a third measuring appliance 36 whose largest side surface 66 also rests against the cooled rear wall 22.

Heat is produced in the control cabinet during operation of the exhaust gas measuring facility. Heat is generated by the temperature of the exhaust gas to be measured which must possibly also be heated to defined temperatures and heat is generated by the electronic system used and the measuring appliances 32, 34, 36 proper. The largest heat quantity is thereby produced at the flame ionization detector analysis appliance 36, and the lowest heat quantity at the infrared detector analysis appliance 32. The measuring appliance 36 generating the largest heat quantity is accordingly arranged in the upper area of the control cabinet 10, while the measuring appliance 32 generating the lowest heat quantity is arranged in the lower area of the control cabinet 10. The hot exhaust gas produced in the control cabinet 10 is dissipated via the fans 52, 60 from the interior 44 of the control cabinet into the channel 40. Despite this dissipation, the exhaust air flow in the channel 40 has a cooling effect since the air flowing upwards and thus also the rear wall 22 are always cooler than the measuring appliance 32, 34, 36 located at the respective height at the rear wall 22, which respectively has a higher temperature so that a cooling effect on the respective measuring appliance 32, 34, 36 at different temperature levels is always provided.

Due to this configuration having a double rear wall and/or the channel 40 formed between the two rear walls 22, 38, heat from the interior 44 of the control cabinet 10 is constantly dissipated upwards and the measuring appliances are actively cooled due to the lower temperature of the rear wall 22. Overloading of the measuring appliances as well as the electronic system in the control cabinet is thus reliably prevented without the need to install additional cooling channels or cooling units. Due to these measures, the thermal load is accordingly reduced and only a minimal additional installation space is required so that the control cabinet can be configured with a very small depth since the largest side surface of the measuring appliances directly rests against the rear wall.

It should be appreciated that the scope of protection of the present invention is not limited to the described exemplary embodiment. The control cabinet can in particular be equipped with other or additional measuring appliances, such as FTIR analysis appliances or quantum cascade lasers or other gas analyzers. The arrangement as well as the connections of the components to each other and to the respective exhaust gas measuring facility as well as the attachment of the second rear wall can also be changed. Reference should also be had to the appended claims.

What is claimed is:

1. A control cabinet for an exhaust gas measuring facility, the control cabinet comprising:
a cabinet body configured to have measuring appliances arranged therein for analyzing at least one sample gas, the cabinet body comprising two side walls, a bottom, a cover, a first rear wall, a second rear wall, a front side, and a channel which is arranged between the first rear wall and the second rear wall, the channel being configured to dissipate heat; and
a door for opening and closing the front side of the cabinet body,
wherein,
the measuring appliances are arranged to rest against the first rear wall.

2. The control cabinet as recited in claim 1, wherein the first rear wall is configured to be actively cooled.

3. The control cabinet as recited in claim 1, wherein,
the measuring appliances each generate a different heat quantity, and
the measuring appliances are arranged further upwards in the cabinet body with an increasing heat quantity generation.

4. The control cabinet as recited in claim 1, wherein,
the first rear wall is arranged to face an interior of the cabinet body, and
the first rear wall comprises a length which is shorter than a length of the second rear wall so that the first rear wall is arranged in a spaced relationship to the bottom of the cabinet body.

5. The control cabinet as recited in claim 4, wherein the control cabinet further comprises at least one fan which is configured to generate an air flow in the channel.

6. The control cabinet as recited in claim 5, further comprising:
a power supply unit arranged between the bottom of the cabinet body and a lower end of the first rear wall, as seen in a vertical direction.

7. The control cabinet as recited in claim 6, wherein the at least one fan is arranged between the bottom of the cabinet body and the lower end of the first rear wall, as seen in the vertical direction.

8. The control cabinet as recited in claim 7, wherein, via the at least one fan, air is delivered from the interior of the cabinet body towards the channel arranged between the first rear wall and the second rear wall.

9. The control cabinet as recited in claim 5, wherein the first rear wall comprises an opening in which the at least one fan is arranged, via which at least one fan air from the interior of the cabinet body is delivered into the channel arranged between the first rear wall and the second rear wall.

10. The control cabinet as recited in claim 9, further comprising:
a cooler arranged at the first rear wall.

11. The control cabinet as recited in claim 10, wherein the cooler and the at least one fan are each arranged at the opening in the first rear wall.

12. The control cabinet as recited in claim 11, wherein,
the measuring appliances each comprise side walls which each comprise a side surface size, and
a largest side surface size of the side walls of each of the measuring appliances is arranged to rest against the first rear wall.

13. The control cabinet as recited in claim 12, further comprising:
cooling coils arranged at the first rear wall, the cooling coils being configured to have a coolant be delivered therethrough.

14. The control cabinet as recited in claim 5, wherein,
the first rear wall ends beneath the cover, and
the at least one fan is arranged in the cover.

* * * * *